(12) United States Patent
Hur

(10) Patent No.: US 7,660,176 B2
(45) Date of Patent: Feb. 9, 2010

(54) SEMICONDUCTOR MEMORY DEVICE AND METHOD FOR DRIVING THE SAME

(75) Inventor: Hwang Hur, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 80 days.

(21) Appl. No.: 11/966,828

(22) Filed: Dec. 28, 2007

(65) Prior Publication Data

US 2008/0239848 A1 Oct. 2, 2008

(30) Foreign Application Priority Data

Apr. 2, 2007 (KR) .................. 10-2007-0032534

(51) Int. Cl.
*G11C 7/00* (2006.01)
(52) U.S. Cl. .................. 365/203; 365/189.11
(58) Field of Classification Search .................. 356/204
See application file for complete search history.

(56) References Cited

U.S. PATENT DOCUMENTS 4,740,926 A * 4/1988 Takemae et al. ............ 365/203
5,418,749 A * 5/1995 Suda et al. .................. 365/203
6,320,806 B1 * 11/2001 Han ........................... 365/203
7,248,517 B2 * 7/2007 Lee et al. .................... 365/203

FOREIGN PATENT DOCUMENTS

JP 09-204777 8/1997
KR 10-2005-0038839 4/2005

OTHER PUBLICATIONS

Foreign office action issued on Oct. 31, 2008 KR Application No. 10-2007-0032534.

* cited by examiner

*Primary Examiner*—Tan T. Nguyen
(74) *Attorney, Agent, or Firm*—IP & T Law Firm PLC

(57) ABSTRACT

A semiconductor memory device includes a write driver, a first precharging unit, and a second precharging unit. The write driver loads data applied to a first data line onto a second data line. The first precharging unit precharges the second data line to a precharging voltage in response to a precharging signal. The second precharging unit overdrives the second data line to a voltage higher than the precharging voltage in response to an overdriving signal enabled for a predetermined time period during an initial precharging interval of the second data line.

25 Claims, 7 Drawing Sheets

SEMICONDUCTOR MEMORY DEVICE AND METHOD FOR DRIVING THE SAME

CROSS-REFERENCE TO RELATED APPLICATIONS

The present invention claims priority of Korean patent application number 10-2007-0032534, filed on Apr. 2, 2007, which is incorporated by reference in its entirety.

BACKGROUND OF THE INVENTION

The present invention relates to semiconductor design technology, and more particularly, to a semiconductor memory device capable of precharging a local input/output (I/O) line to a stable voltage level.

Generally, a plurality of memory banks are designed in a semiconductor memory device such as a double data rate (DDR) synchronous dynamic random access memory (SDRAM), and each memory bank is comprised of a plurality of cell arrays. Each cell array comprises cell groups, each of a plurality of memory cells. The memory cell includes a cell transistor and a cell capacitor, and stores one bit of data.

Herein, an area where the memory bank is located is a core cell region, and an area which is formed for inputting/outputting data to/from the memory bank is a peripheral circuit region. The data transferred to the peripheral circuit region through a data input/output (I/O) pin in a write operation of the semiconductor memory device is inputted into the core cell region through a write driver located on a boundary of the core cell region. Generally, a data line coupled to the data I/O pin and the write driver to transfer data is a global input/output (I/O) line GIO, and a plurality of the global I/O lines is called a global input/output (I/O) bus GIO_BUS. The data transferred through the write driver is written in the corresponding memory cell, wherein a data line that is shared with the write driver and each memory cell is called a local input/output (I/O) line LIO.

On the other hand, a precharge operation of the local I/O line LIO is performed as a means to reduce power consumption and increase speed in the semiconductor memory. The precharge operation is performed before the write operation in the semiconductor memory device to bring the local I/O line LIO to a precharging voltage level of a constant voltage level so as to obtain the write operation with higher speed and low power consumption.

FIG. 1 is a block diagram illustrating a partial structure of a conventional semiconductor memory device.

As shown, the conventional semiconductor memory device includes a memory bank 110, a plurality of write drivers 130A and 130B, a plurality of lower precharging units 150A and 150B, and a plurality of upper precharging units 170A and 170B.

The memory bank 110 includes a plurality of cell arrays and sub_hole areas to share a plurality of local I/O lines LIO<0>, /LIO<0>, LIO<1>, and /LIO<1>. Each of write drivers 130A and 130B is connected between a corresponding pair of local I/O lines LIO<0>, /LIO<0> and LIO<1>, /LIO<1>, and a global I/O bus GIO_BUS. Each of lower precharging units 150A and 150B is connected to a corresponding pair of local I/O lines LIO<0>, /LIO<0> and LIO<1>, /LIO<1>. Each of upper precharging units 170A and 170B is located on the other side of the write driver 130A and 130B on the basis of the memory bank 110 and connected to a corresponding pair of local I/O lines LIO<0>, /LIO<0> and LIO<1>, /LIO<1>.

Herein, a plurality of memory cells are provided in the cell array area, and a sense amplifier driver (not shown) is provided in the upper side and the lower side of each cell array area. The sub_hole includes plural circuits sub_hole such as a power source generating unit of the sense amplifier driver (not shown) for generating a power source of the sense amplifier driver corresponding to the cell array, a word line repeater (not shown), and an I/O switch (not shown), etc.

FIG. 2 is a block diagram illustrating a write operation and a precharge operation of the conventional semiconductor memory device.

For the sake of convenience, FIG. 2 shows a partial structure connected to a pair of local I/O lines LIO<0> and /LIO<0> shown in FIG. 1.

With reference to FIG. 2, the simple write operation will be described.

A data input from a global I/O line GIO<0> is applied to a write driver 130A, and the write driver 130A drives the pair of local I/O lines LIO<0> and /LIO<0> to pull up or pull down according to the data applied thereto in response to an enable signal BWEN. Here, the pair of local I/O lines LIO<0> and /LIO<0> comprises a main local I/O line LIO<0> and a sub local I/O line /LIO<0>. For example, the write driver 130A drives the main local I/O line LIO<0> to pull up and the sub local I/O line /LIO<0> to pull down, when the applied data is a logic high level. When the applied data is a logic low level, the write driver 130A drives the main local I/O line LIO<0> to pull down and the sub local I/O line /LIO<0> to pull up.

The data transmitted through the pair of local I/O lines LIO<0> and /LIO<0> is written in the memory cell of the corresponding cell array. The pull up/pull down operation of the main and sub local I/O lines LIO<0> and /LIO<0> is illustrated in FIG. 3.

Subsequently, the precharge operation of the pair of local I/O lines LIO<0> and /LIO<0> before or after the write operation will be described.

First, the lower precharging unit 150A precharges the pair of local I/O lines LIO<0> and /LIO<0> in response to an inverted reset signal RSTB, and the upper precharging unit 170A precharges the pair of local I/O lines LIO<0> and /LIO<0> in response to a reset signal RST. Herein, the inverted reset signal RSTB is generated by inverting the reset signal RST. Further, a signal for precharging the pair of local I/O lines LIO<0> and /LIO<0> such as the reset signal RST and the inverted reset signal RSTB may be changed according to a circuit structure of the lower and upper precharging units 150A and 170A.

For reference, an input/output (I/O) switch 160A includes an n-type metal-oxide semiconductor (NMOS) transistor having a drain-source path connected between the main local I/O line LIO<0> and the sub local I/O line /LIO<0>, and a gate receiving the reset signal RST. In addition, the I/O switch 160A connects the main local I/O line LIO<0> to the sub local I/O line /LIO<0> to equalize voltage levels between two lines in response to the reset signal RST. FIG. 3 illustrates a more detailed write operation, and FIGS. 3 and 4 illustrate the precharge operation.

FIG. 3 is a circuit diagram of the write driver 130A and the lower precharging unit 150A of FIG. 2.

FIG. 3 shows the write driver 130A and the lower precharging unit 150A, wherein the write driver 130A loads data applied on the global I/O line GIO<0> to the pair of local I/O lines LIO<0> and /LIO<0> in response to the enable signal BWEN, and the lower precharging unit 150A precharges the pair of local I/O lines LIO<0> and /LIO<0> to a voltage level of a core voltage VCORE in response to the inverted reset signal RSTB.

In the write operation of the write driver 130A, the inverted reset signal RSTB maintains a logic high level.

If data applied to the global I/O line GIO<0> is a logic high level, a logic low level is latched to a first latching unit LAT1 and the logic high level is latched to a second latching unit LAT2. Thereafter, when the enable signal BWEN is a logic high level, a second driving control signal CTR_DRV2 is a logic low level, thereby to drive the main local I/O line LIO<0> to pull up and the sub local I/O line /LIO<0> to pull down according to the logic levels latched to the first and the second latching units LAT1 and LAT2.

In contrast, if the data applied to the global I/O line GIO<0> is a logic low level, a logic high level is latched to the first latching unit LAT1 and the logic low level is latched to the second latching unit LAT2 so as to drive the main local I/O line LIO<0> to pull down and the sub local I/O line /LIO<0> to pull up. The pair of local I/O lines LIO<0> and /LIO<0> driven to pull up/pull down transmits data to the memory cell of the corresponding cell array.

The lower precharging unit 150A includes first to third PMOS transistors PM1, PM2, and PM3. The first PMOS transistor PM1 has a source-drain path connected between the core voltage VCORE and the main local I/O line LIO<0>, and a gate receiving a signal corresponding to the inverted reset signal RSTB. The second PMOS transistor PM2 includes a source-drain path connected between the core voltage VCORE and the sub local I/O line /LIO<0>, and a gate receiving the signal corresponding to the inverted reset signal RSTB. The third PMOS transistor PM3 includes a source-drain path connected between the main local I/O line LIO<0> and the sub local I/O line /LIO<0>, and a gate receiving the signal corresponding to the inverted reset signal RSTB.

In the precharge operation of the lower precharging unit 150A, if the inverted reset signal RSTB is a logic low level, the first to third PMOS transistors PM1 to PM3 of the lower precharging unit 150A are turned on so that the pair of local I/O lines LIO<0> and /LIO<0> is precharged to the voltage level of the core voltage VCORE. Further, the first to third PMOS transistors PM1 to PM3 equalize the voltage level of the main local I/O line LIO<0> and the sub local I/O line /LIO<0>.

FIG. 4 is a circuit diagram of the upper precharging unit 170A of FIG. 2.

As shown, the upper precharging unit 170A includes first to third PMOS transistors PM4, PM5, and PM6. The first PMOS transistor PM4 includes a source-drain path connected between the core voltage VCORE and the main local I/O line LIO<0> and a gate receiving a signal corresponding to the reset signal RST. The second PMOS transistor PM5 includes a source-drain path connected between the core voltage VCORE and the sub local I/O line /LIO<0> and a gate receiving the signal corresponding to the reset signal RST. The third PMOS transistor PM6 includes a source-drain path connected between the main local I/O line LIO<0> and the sub local I/O line /LIO<0> and a gate receiving the signal corresponding to the reset signal RST.

In the precharge operation of the upper precharging unit 170A, if the reset signal RST is a logic high level, the first to third PMOS transistors PM4 to PM6 of the upper precharging unit 170A are turned on so that the pair of local I/O lines LIO<0> and /LIO<0> is precharged to the voltage level of the core voltage VCORE, and equalize the voltage level of the main local I/O line LIO<0> and the sub local I/O line /LIO<0>.

Referring back to FIG. 1, when the memory bank 110 shares the pair of local I/O lines LIO<0> and /LIO<0>, the precharge operation is performed to the voltage level of the core voltage VCORE in the pair of local I/O lines LIO<0> and /LIO<0> through the lower precharging unit 150A and the upper precharging unit 170A. In order to precharge the pair of local I/O lines LIO<0> and /LIO<0> to the voltage level of the core voltage VCORE more quickly, the lower precharging unit 150A and the upper precharging unit 170A are provided.

In other words, since the pair of local I/O lines LIO<0> and /LIO<0> is very long lines in the semiconductor memory device, when the precharge operation is performed only by one of the lower precharging unit 150A and the upper precharging unit 170A, it takes a long time for all portion of the pair of local I/O lines LIO<0> and /LIO<0> to be up to the voltage level of the core voltage VCORE. If so, operation after the precharge operation may be also delayed.

Consequently, there is a disadvantage of increasing the total operation time of the semiconductor memory device. To solve the problem, the lower precharging unit 150A and the upper precharging unit 170A are provided on both sides of the pair of local I/O lines LIO<0> and /LIO<0> to perform the precharge operation.

However, since a voltage level of an external source voltage VDD is decreased and rapid operation speed of the memory device is desired, it is required that the pair of local I/O lines LIO<0> and /LIO<0> is more stably and quickly precharged up to the desired voltage level.

Furthermore, in the precharging operation of the plurality of pairs of local I/O lines according to the conventional structure, there is a problem that the voltage level of the core voltage VCORE is not stable when the plurality of pairs of local I/O lines are precharged at the same time using the core voltage VCORE.

SUMMARY OF THE INVENTION

Embodiments of the invention are directed to a semiconductor memory device capable of precharging a local I/O line to a stable voltage level in a faster way.

Embodiments of the invention are also directed to a semiconductor memory device capable of reducing a load of current consumed in a core voltage when precharging a local I/O line.

In accordance with an aspect of the invention, there is provided a semiconductor memory device, including: a write driver configured to load data applied to a first data line onto a second data line; a first precharging unit configured to precharge the second data line to a precharging voltage in response to a precharging signal; and a second precharging unit configured to overdrive the second data line to a voltage higher than the precharging voltage in response to an overdriving signal enabled for an predetermined time period during an initial precharging interval of the second data line.

In accordance with an aspect of the invention, there is provided a semiconductor memory device, including: a unit memory cell region sharing a first and a second data line; a write driver for loading data applied to the first data line on the second data line; a first precharging unit for precharging the second data line to a precharging voltage in response to a reset signal; a second precharging unit, configured to precharge the second data line to the precharging voltage in response to a precharging signal, the first precharging unit and the second precharging unit respectively being located on opposite first and second sides of the unit memory cell region; and a third precharging unit, configured to overdrive the second data line to a voltage higher than the precharging voltage in response to an overdriving signal enabled only for an predetermined time period at an initial precharging interval of the second data line, the third precharging unit being located on the second side of the unit memory cell region.

In accordance with an aspect of the invention, there is provided a method for driving a semiconductor memory device, including: precharging a data line to a precharging voltage in response to a precharging signal; and overdriving the data line to a voltage higher than the precharging voltage in response to the overdriving signal enabled for an predetermined time period at an initial precharging interval of the data line.

DESCRIPTION OF SPECIFIC EMBODIMENTS

Hereinafter, the invention and exemplary embodiments thereof are more fully described below with reference to the accompanying drawings for being easily implemented by those of ordinary skill in the art.

Figure 5:
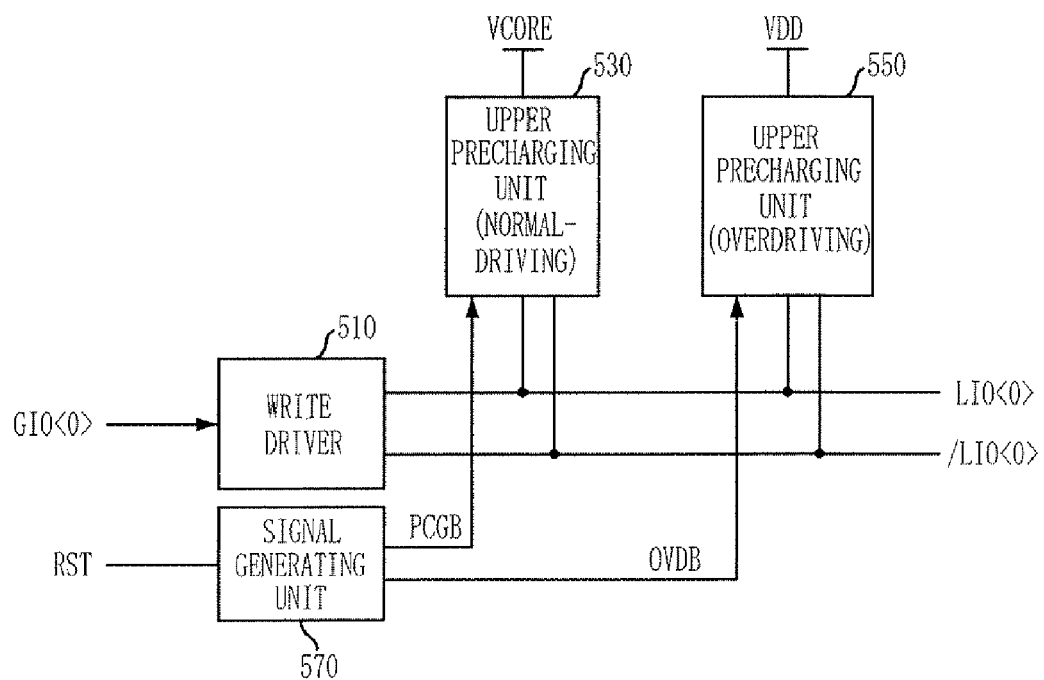
FIG. 5 is a block diagram illustrating a partial structure of a semiconductor memory device in accordance with an embodiment of the invention.

FIG. 5 is a block diagram illustrating a partial structure of a semiconductor memory device in accordance with an embodiment of the invention.

For the sake of convenience, the description will be made in relation to a pair of local I/O lines LIO<0> and /LIO<0>.

As shown, the semiconductor memory device includes a write driver 510, a first precharging unit 530, and a second precharging unit 550. The write driver 510 loads data of a global I/O line GIO<0> on the pair of local I/O lines LIO<0> and /LIO<0>. The first precharging unit 530 precharges the pair of local I/O lines LIO<0> and /LIO<0> to a voltage level of a core voltage VCORE in response to a precharging signal PCGB. The second precharging unit 550 overdrives the pair of local I/O lines LIO<0> and /LIO<0> to a voltage level of an external voltage VDD in response to an overdriving signal OVDB.

In accordance with the invention, the semiconductor memory device further includes a signal-generating unit 570 for generating the precharging signal PCGB and the overdriving signal OVDB in response to a reset signal RST. Here, the overdriving signal OVDB is enabled only for an predetermined time period at an initial stage of the precharge operation of the pair of local I/O lines LIO<0> and /LIO<0>.

Accordingly, the pair of local I/O lines LIO<0> and /LIO<0> is overdriven up to the voltage level of the external voltage VDD higher than that of the core voltage VCORE for the predetermined time period at the initial stage of the precharge operation, and then they may be normally driven to the voltage level of the core voltage VCORE. Ultimately, the pair of local I/O lines LIO<0> and /LIO<0> may be more quickly precharged to the stable precharging voltage level quickly by adding the second precharging unit 550.

Three embodiments in accordance with the invention are described herein below. All of three embodiments are provided in order to more quickly precharge the pair of local I/O lines LIO<0> and /LIO<0> up to the stable precharging voltage level in the precharge operation.

Figure 1:
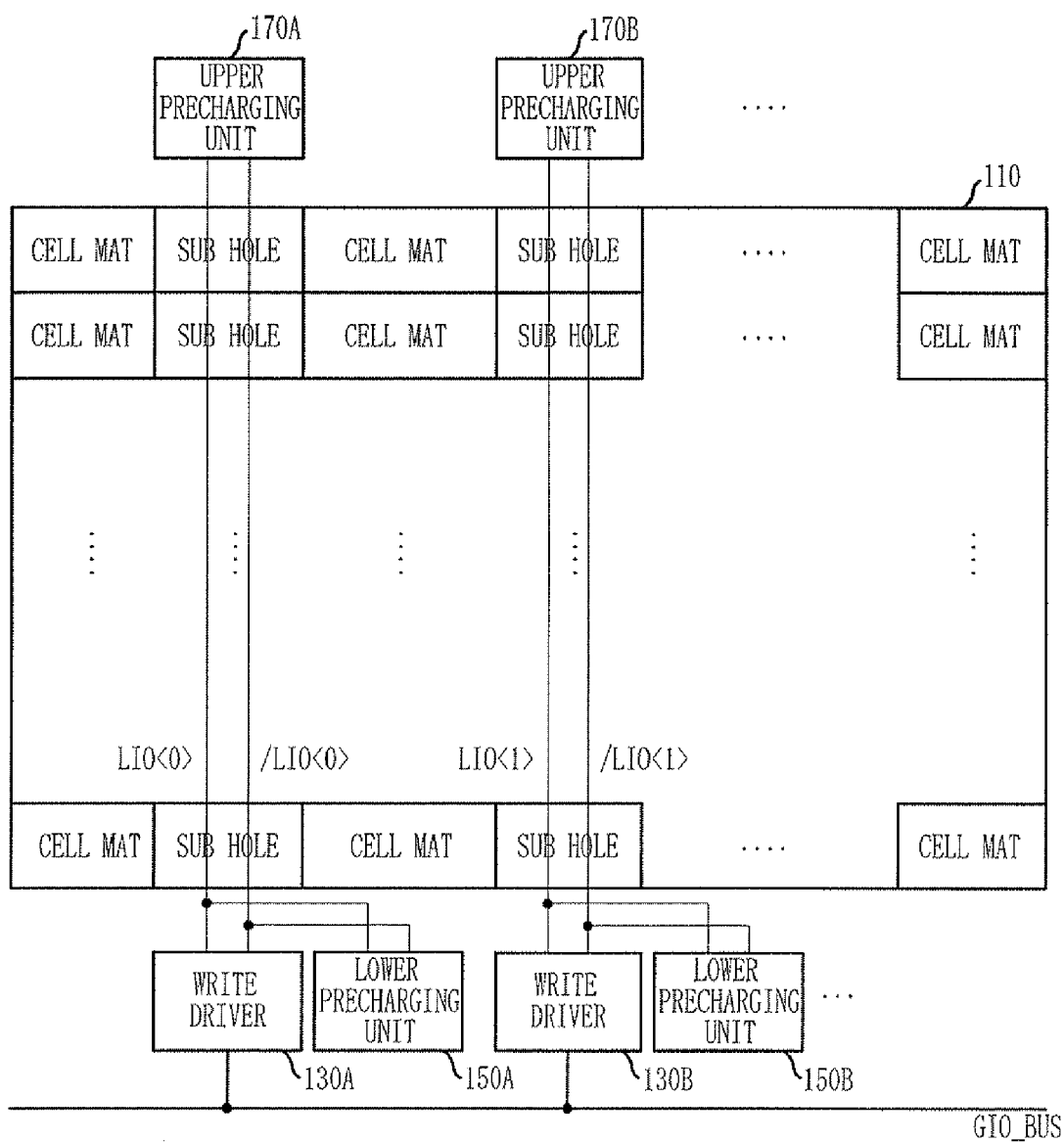
FIG. 1 is a block diagram illustrating a partial structure of a conventional semiconductor memory device.

Referring back to FIG. 1, the following elements according to three embodiments corresponds to each of the lower precharging units 150A and 150B, and the upper precharging units 170A and 170B, or both of the lower and the upper precharging units.

Figure 2:
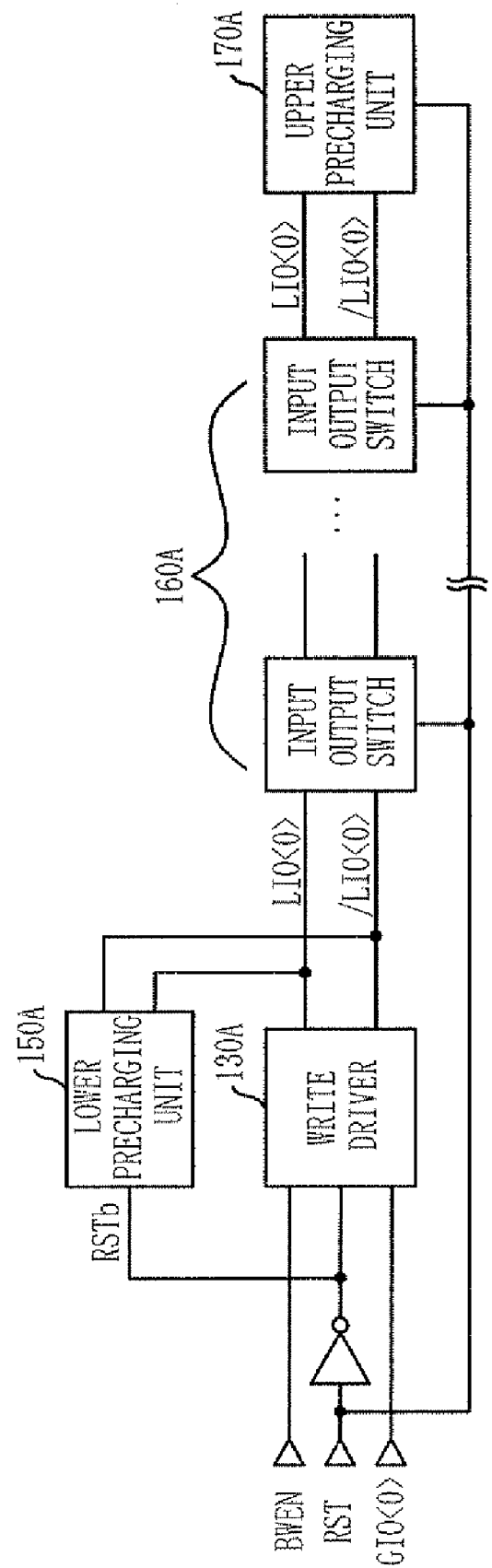
FIG. 2 is a block diagram illustrating a write operation and a precharge operation of the conventional semiconductor memory device.
Figure 6A:
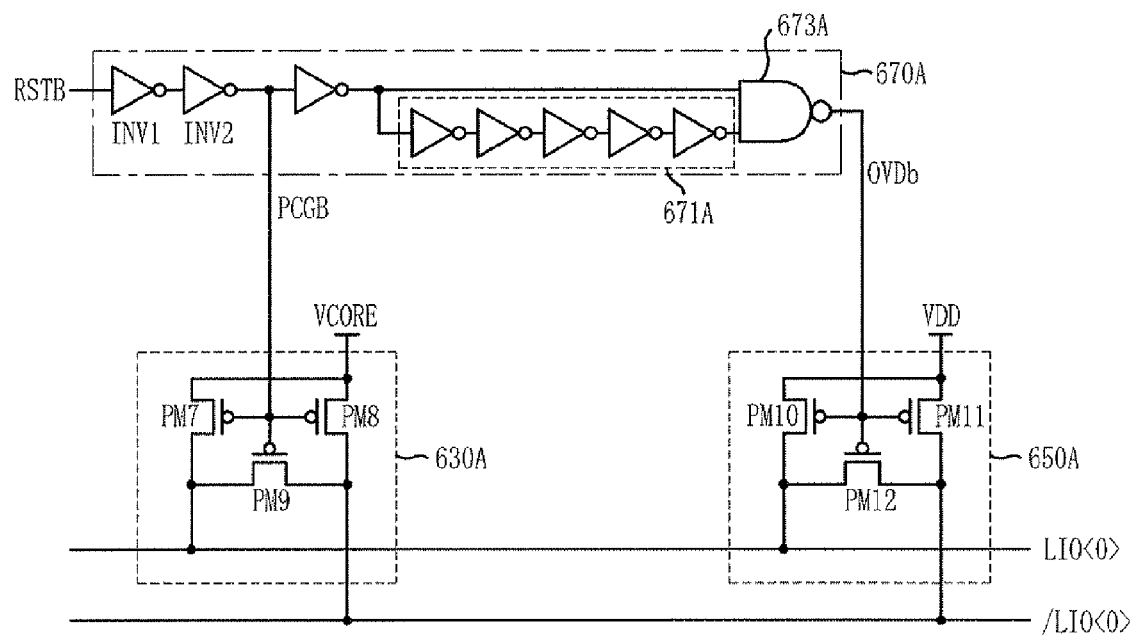
FIG. 6A is a circuit diagram illustrating a second lower precharging unit in accordance with a first embodiment of the invention.
Figure 6B:
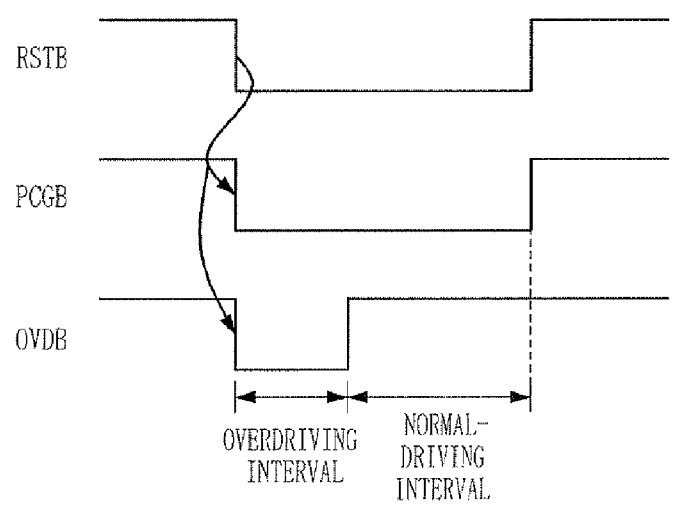
FIG. 6B is a timing diagram illustrating a precharging signal and an over-driving signal shown in FIG. 6A.
Figure 6C:
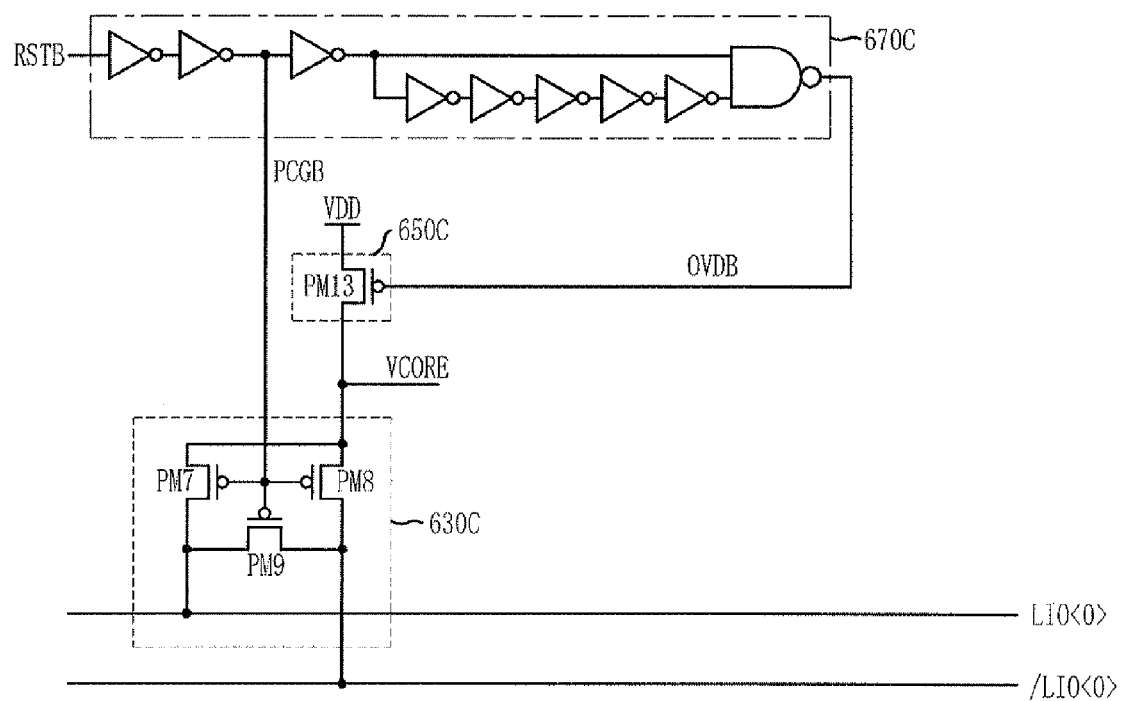
FIG. 6C is a circuit diagram illustrating a second lower precharging unit in accordance with a second embodiment of the invention.

For the sake of convenience, in a first embodiment of FIG. 6A and a second embodiment of FIG. 6C, the first precharging unit 530 corresponds to the lower precharging unit 150A of FIG. 2, and the first precharging unit 530 is referred as "a first lower precharging unit" and the second precharging unit 550 is referred as "a second lower precharging unit". In a third embodiment of FIG. 7A, the first precharging unit 530 corresponds to the upper precharging unit 170A of FIG. 2, and the first precharging unit 530 is referred as "a first upper precharging unit" and the second precharging unit 550 is referred as "a second upper precharging unit".

FIG. 6A is a circuit diagram illustrating a second lower precharging unit 650A in accordance with the first embodiment of the invention.

As shown, the first embodiment of the invention shows a first lower precharging unit 630A for precharging the pair of local I/O lines LIO<0> and /LIO<0> to the voltage level of the core voltage VCORE in response to the precharging signal PCGB, and the second lower precharging unit 650A for overdriving the pair of local I/O lines LIO<0> and /LIO<0> to the voltage level of the external voltage VDD in response to the overdriving signal OVDB.

According to the first embodiment of the invention, a signal generating unit 670A is further provided for generating the precharging signal PCGB and the overdriving signal OVDB in response to the inverted reset signal RSTB. Herein, the overdriving signal OVDB is a signal that is enabled only for an predetermined time period at the initial stage of the pre-charge operation of the pair of local I/O lines LIO<0> and /LIO<0> in response to the inverted reset signal RSTB, and has a pulse width corresponding to the predetermined time period.

The first lower precharging unit 630A includes first to third PMOS transistors PM7, PM8 and PM9. The first PMOS transistor PM7 includes a source-drain path connected between the core voltage VCORE and the main local I/O line LIO<0> and a gate receiving the precharge signal PCGB. The second PMOS transistor PM8 includes a source-drain path connected between the core voltage VCORE and the sub local I/O line /LIO<0> and a gate receiving the precharge signal PCGB. The third PMOS transistor PM9 includes a source-drain path connected between the main local I/O line LIO<0> and the sub local I/O line /LIO<0> and a gate receiving the precharge signal PCGB.

The second lower precharging unit 650A includes fourth to sixth PMOS transistors PM10, PM11, and PM12. The fourth PMOS transistor PM10 includes a source-drain path connected between the external voltage VDD and the main local I/O line LIO<0> and a gate receiving the overdriving signal OVDB. The fifth PMOS transistor PM11 includes a source-drain path connected between the external voltage VDD and the sub local I/O line /LIO<0> and a gate receiving the overdriving signal OVDB. The sixth PMOS transistor PM12 includes a source-drain path connected between the main local I/O line LIO<0> and the sub local I/O line /LIO<0> and a gate receiving the overdriving signal OVDB.

The signal generating unit 670A includes a delay unit 671A and an output unit 673A. The delay unit 671A receives a signal corresponding to the inverted reset signal RSTB and then delays for the predetermined time period. The output unit 673A receives the signal corresponding to the inverted reset signal RSTB and an output signal of the delay unit 671A, and then outputs the overdriving signal OVDB. The signal generating unit 670A may generate the precharging signal PCGB corresponding to the inverted reset signal RSTB.

The delay unit 671A includes a plurality of inverters, e.g., 5 inverters connected in series, and the output unit 673A includes an NAND gate performing a NAND operation on the signal corresponding to the inverted reset signal RSTB and the output signal of the delay unit 671A, thereby outputting the overdriving signal OVDB.

Figure 3:
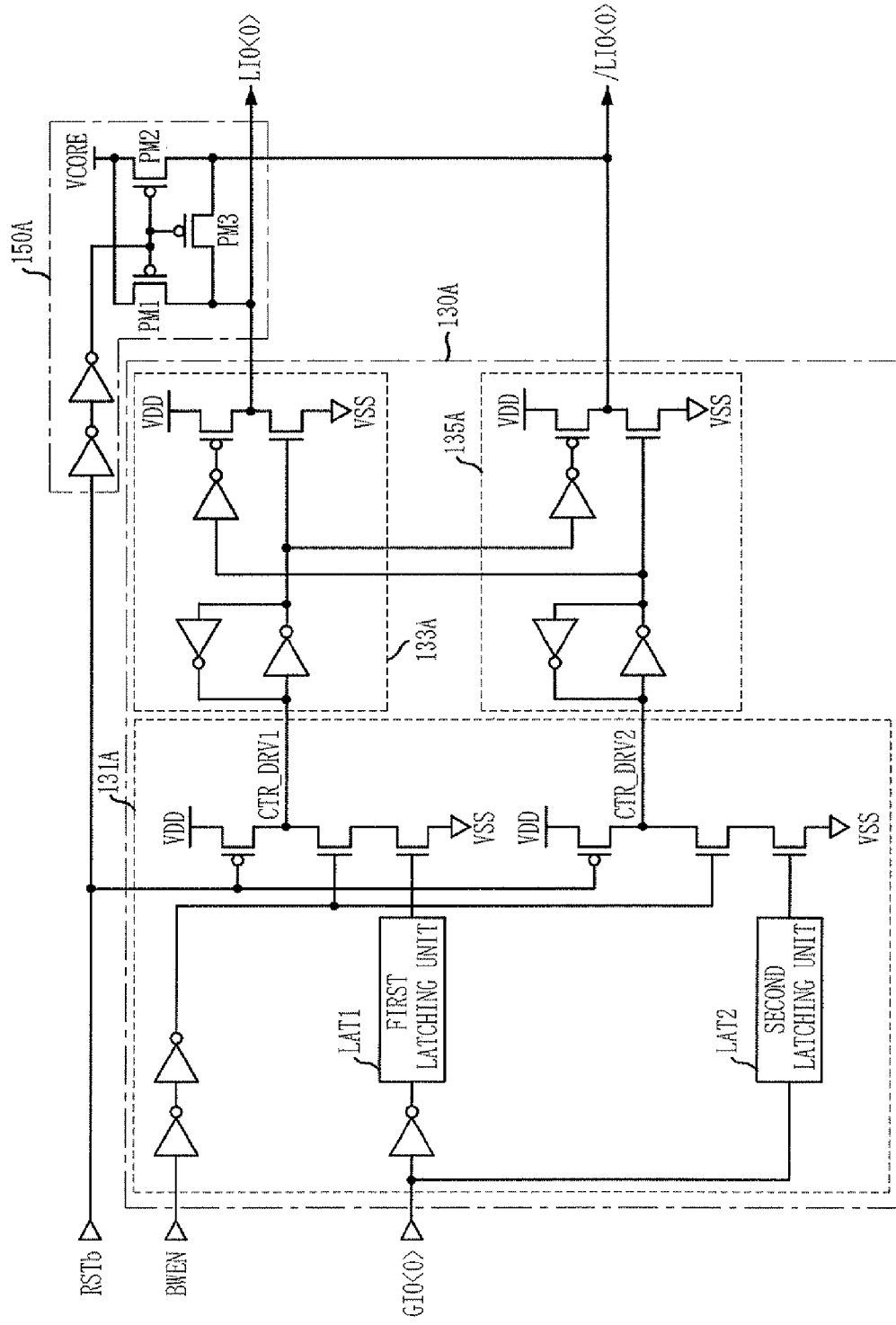
FIG. 3 is a circuit diagram of a write driver and a lower precharging unit of FIG. 2.

On the other hand, the signal generating unit 670A can further contains a first inverter INV1 and a second inverter INV2. The first inverter INV1 inverts the reset signal RSTB, and the second inverter INV2 inverts an output signal of the inverter INV1 to output the signal corresponding to the inverted reset signal RSTB. It intends to set the same timing as the conventional inverted reset signal RSTB in FIG. 3 passing the two inverters, and their designs can be variable depending on design choice.

FIG. 6B is a timing diagram illustrating the precharging signal PCGB and the over-driving signal OVDB of FIG. 6A.

For reference, when the inverted reset signal RSTB is a logic high level, the write operation is performed, and when the inverted reset signal RSTB is a logic low level, the precharge operation of the local I/O line LIO<0> is performed.

With reference to FIGS. 6A and 6B, when the inverted reset signal RSTB is a logic high level in the write operation, the precharging signal PCGB remains a logic high level so that the first to third PMOS transistors PM7 to PM9 of the first lower precharging unit 630A are turned off. The overdriving signal OVDB also remains a logic high level so that the fourth to sixth PMOS transistors PM10 to PM12 of the second lower precharging unit 650A are turned off.

After that, when the inverted reset signal RSTB is changed to a logic low level in order to perform the precharge operation of the pair of local I/O lines LIO<0> and /LIO<0>, the precharging signal PCGB becomes a logic low level. The first to third PMOS transistors PM7 to PM9 of the first lower precharging unit 630A are turned on so that the pair of local I/O lines LIO<0> and /LIO<0> is precharged to the voltage level of the core voltage VCORE.

On the other hand, when the inverted reset signal RSTB is changed to a logic low level, the overdriving signal OVDB also becomes a logic low level so that the fourth to sixth PMOS transistors PM10 to PM12 of the second lower precharging unit 650A are turned on. Accordingly, the pair of local I/O lines LIO<0> and /LIO<0> is overdriven to the voltage level of the external voltage VDD. After a delay time period by the delay unit 671A, the overdriving signal OVDB is changed to a logic high level so that the fourth to sixth PMOS transistors PM10 to PM12 of the second lower precharging unit 650A are turned off.

Consequently, at an enable interval of the overdriving signal OVDB (hereinafter referred to as "overdriving period"), the pair of local I/O lines LIO<0> and /LIO<0> is overdriven to the voltage level of the external voltage VDD, and at a disable interval of the overdriving signal OVDB (hereinafter referred to as "normal-driving period"), the pair of local I/O lines LIO<0> and /LIO<0> is driven to the voltage level of the core voltage VCORE.

FIG. 6C is a circuit diagram for illustrating a second lower precharging unit 650C in accordance with the second embodiment of the invention.

FIG. 6C shows a first lower precharging unit 630C, a second lower precharging unit 650C, and a signal generating unit 670C. The elements and the operation of the first lower precharging unit 630C and the signal generating unit 670C of the second embodiment are substantially the same as those of the first embodiment, so that specific description will be omitted because it is obvious to a person of ordinary skill in the art. Hereinafter, the second lower precharging unit 650C closely related to the second embodiment according to the invention will be described.

The second lower precharging unit 650C is used for driving the pair of local I/O lines LIO<0> and /LIO<0> to the voltage level of the external voltage VDD in response to the overdriving signal OVDB. The second lower precharging unit 650C may include a seventh PMOS transistor PM13 including a source-drain path connected between the external voltage VDD and the core voltage VCORE and a gate receiving the overdriving signal OVDB. Here, the overdriving signal OVDB has the same timing diagram as one of FIG. 6B.

With reference to FIGS. 6B and 6C for the purpose of describing the operation, when the inverted reset signal RSTB is a logic high level in the write operation, the precharging signal PCGB remains a logic high level so that the first to third PMOS transistors PM7 to PM9 of the first lower precharging unit 630C are turned off. The overdriving signal OVDB also remains a logic high level so that the seventh PMOS transistor PM13 of the second lower precharging unit 650C is turned off.

After that, when the inverted reset signal RSTB is changed to a logic low level for the precharge operation of the pair of local I/O lines LIO<0> and /LIO<0>, the precharging signal PCGB becomes a logic low level. When the first to third PMOS transistors PM7 to PM9 of the first lower precharging unit 630C are turned on according to the precharging signal PCGB, the pair of local I/O lines LIO<0> and /LIO<0> is precharged up to the voltage level of the core voltage VCORE.

On the other hand, when the inverted reset signal RSTB is changed to a logic low level, the overdriving signal OVDB also becomes a logic low level so that the seventh PMOS transistor PM13 of the second lower precharging unit 650C is turned on according to the overdriving signal OVDB. Accordingly, the core voltage VCORE is overdriven to the voltage level of the external voltage VDD. After the predetermined delay time period, the overdriving signal OVDB is changed to a logic high level so that the seventh PMOS transistor PM13 of the second lower precharging unit 650A is turned off.

Consequently, as the same as the first embodiment, at the overdriving period, the pair of local I/O lines LIO<0> and /LIO<0> is overdriven to the voltage level of the core voltage VCORE overdriven to the voltage level of the external voltage VDD, and at the normal-driving period, the pair of local I/O lines LIO<0> and /LIO<0> is driven to the voltage level of the core voltage VCORE.

Returning back to FIG. 1, a region capable of designing the second precharging unit 550 is described.

If a region in which a cell array and a sub_hole region are designed is called as a cell region, a plurality of write drivers 130A and 130B, a plurality of lower precharging units 150A and 150B, and a global I/O bus GIO_BUS are arranged in a lower side of the cell region (hereinafter, referred to as "a lower region"). A plurality of upper precharging units 170A and 170B are arranged in an upper side of the cell region (hereinafter, referred to as "an upper region").

For the sake of convenience, the pair of local I/O lines LIO<0> and /LIO<0> is explained.

The second precharging unit 550 according to invention is intend to overdrive the pair of local I/O lines LIO<0> and /LIO<0> to the voltage level of the external voltage VDD at the initial interval only for the predetermined time period. Accordingly, the second precharging unit 550 has to be connected to the pair of local I/O lines LIO<0> and /LIO<0>. Thus the second precharging unit 550 may be provided in the lower region, the cell region, or the upper region.

Subsequently, a density of circuits designed in each region will be described.

The cell region includes the cell array and the sub_hole area. Herein, numerous memory cells are designed on the cell array, and circuits such as a power generating unit of a sense amplifier driver, a word line repeater, and an I/O switch, etc, which correspond to the corresponding cell array, are provided to the sub_hole area. So it is accompanied with a large load that the second precharging unit 550 is further inserted in the cell region.

In the lower region, the write drivers 130A, the lower precharging unit 150A, and the global I/O bus GIO_BUS are contained. Thus it may cause a great burden in the lower region when the second precharging unit 550 is further added therein.

The upper precharging unit 170A is provided in the upper region. Accordingly, there is enough space on the upper region for an additional circuit to be added as compared with the cell region and the lower region. That is, it is more suitable for additionally inserting the second precharging unit 550 in the upper region.

Figure 7A:
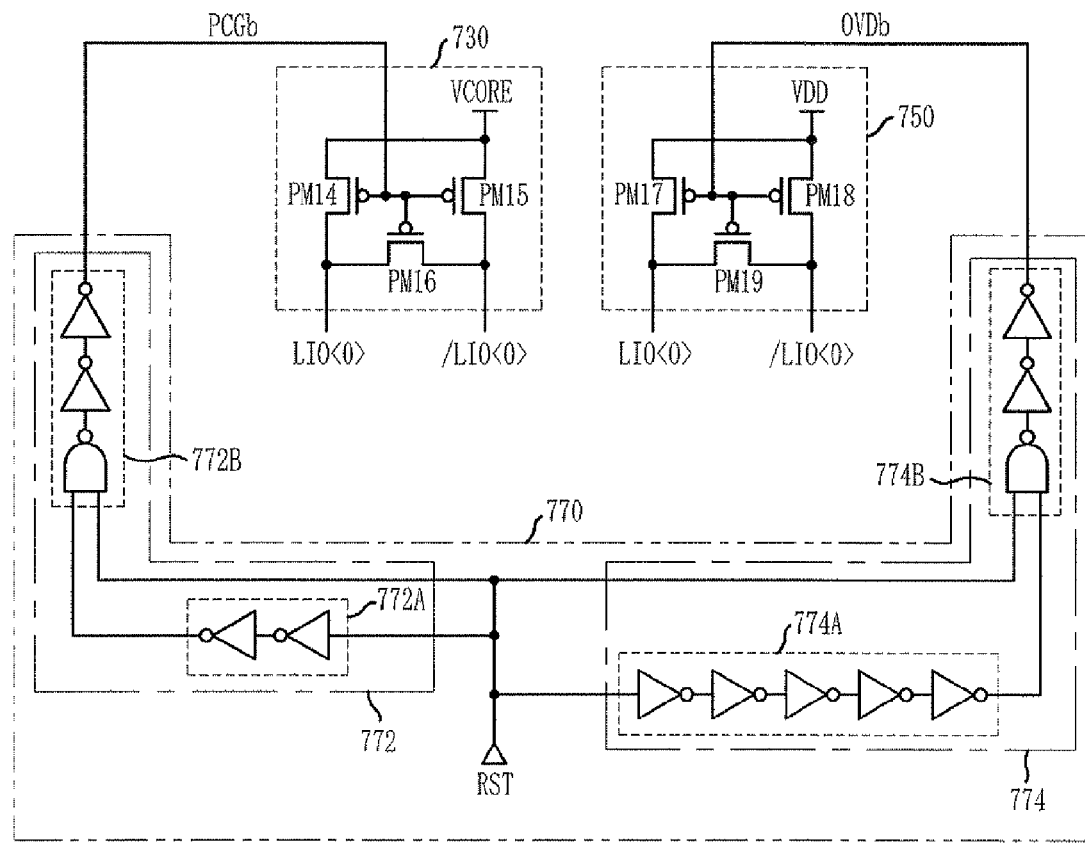
FIG. 7A is a circuit diagram illustrating a second upper precharging unit in accordance with a third embodiment of the invention.

FIG. 7A is a circuit diagram for illustrating a second upper precharging unit 750, which is provided on the upper region in accordance with the third embodiment of the invention.

As shown, the third embodiment of the invention shows a first upper precharging unit 730 for precharging the pair of local I/O lines LIO<0> and /LIO<0> to a voltage level of a core voltage VCORE in response to a precharging signal PCGB, and the second upper precharging unit 750 for overdriving the pair of local I/O lines LIO<0> and /LIO<0> to a voltage level of an external voltage VDD in response to an overdriving signal OVDB.

In accordance with the third embodiment of the invention, a signal-generating unit 770 is further provided in order to generate the precharging signal PCGB and the overdriving signal OVDB in response to the reset signal RST.

Here, the overdriving signal OVDB is enabled in response to the reset signal RST only for an predetermined time period at the initial interval of a precharge operation to the pair of local I/O lines LIO<0> and /LIO<0>, and has pulse width corresponding to the predetermined time period. The precharging signal PCGB is enabled after the overdriving signal OVDB is enabled, and the timing of enablement depends on the purpose of a designer for decreasing consumption power in the core voltage VCORE.

The first upper precharging unit 730 may include first to third PMOS transistors PM14, PM15, and PM16. The first PMOS transistor PM14 includes a source-drain path connected between the core voltage VCORE and the main local I/O line LIO<0> and a gate receiving the precharge signal PCGB. The second PMOS transistor PM15 includes a source-drain path connected between the core voltage VCORE and the sub local I/O line /LIO<0> and a gate receiving the precharge signal PCGB. The third PMOS transistor PM16 includes a source-drain path connected between the main local I/O line LIO<0> and the sub local I/O line /LIO<0> and a gate receiving the precharge signal PCGB.

The second upper precharging unit 750 may include fourth to sixth PMOS transistors PM17, PM18, and PM19. The fourth PMOS transistor PM17 includes a source-drain path connected between the external voltage VDD and the main local I/O line LIO<0> and a gate receiving the overdriving signal OVDB. The fifth PMOS transistor PM18 includes a source-drain path connected between the external voltage VDD and the sub local I/O line /LIO<0> and a gate receiving the overdriving signal OVDB. The sixth PMOS transistor PM19 includes a source-drain path connected between the main local I/O line LIO<0> and the sub local I/O line /LIO<0> and a gate receiving the overdriving signal OVDB.

The signal-generating unit 770 may contain a precharging signal generating unit 772 for generating the precharging signal PCGB in response to the reset signal RST, and an overdriving signal generating unit 774 for generating the overdriving signal OVDB in response to the reset signal RST.

The precharging signal generating unit 772 may contain a first delay unit 772A for receiving and delaying the reset signal RST, and a first output unit 772B for receiving the reset signal RST and an output signal of the delay unit 772A to generate the precharging signal PCGB.

The overdriving signal generating unit 774 may contain a second delay unit 774A for receiving and delaying the reset signal RST for the predetermined time period, and a second output unit 774B for receiving the reset signal RST and an output signal of the second delay unit 774A to generate the overdriving signal OVDB. Here, the first delay unit 772A includes a plurality of inverters, e.g., 2 inverters connected in series, and the second delay unit 774A includes a plurality of inverters, e.g., five inverters connected in series.

Figure 4:
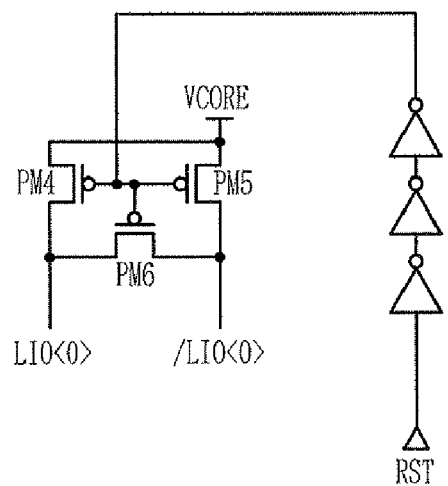
FIG. 4 is a circuit diagram of an upper precharging unit of FIG. 2.

On the other hands, the first and the second output units 774A and 774B are intend to set the same timing as the conventional reset signal RST in FIG. 4 passing the three inverters, and their designs can be variable depending on situations. Also, the designs of the first and the second delay units 772A and 774A may be changed when the overdriving signal OVDB at the initial interval of the precharging operation to the pair of local I/O lines LIO<0> and /LIO<0> is enabled and then the precharging signal PCGB is enabled.

Figure 7B:
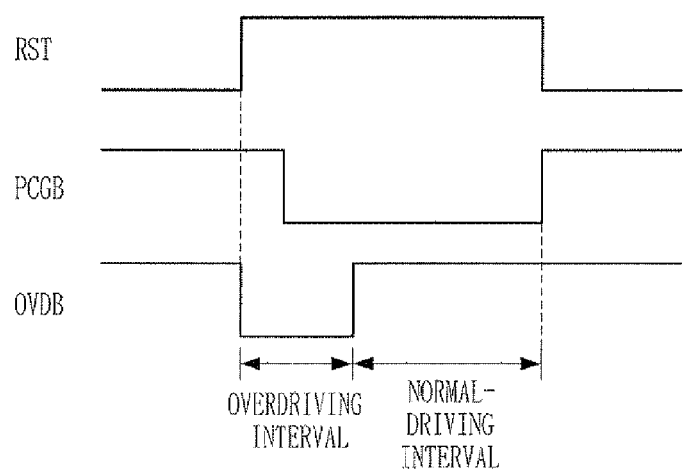
FIG. 7B is a timing diagram illustrating a precharging signal and an over-driving signal shown in FIG. 7A.

FIG. 7B is a timing diagram illustrating the precharging signal PCGB and the over-driving signal OVDB of FIG. 7A.

For reference, when the reset signal RST is a logic low level, the write operation is performed, and when the reset signal RST is a high level logic, the precharge operation of the main local I/O line LIO<0> and /LIO<0> is performed.

Referring to FIGS. 7A and 7B, when the reset signal RST is a logic low level in the write operation, the precharging signal PCGB remains a logic high level so that the first to third PMOS transistors PM14 to PM16 of the first upper precharging unit 730 are turned off. The overdriving signal OVDB also remains a logic high level so that the fourth to sixth PMOS transistors PM17 to PM19 of the second upper precharging unit 750 are turned off.

After that, when the reset signal RST is changed to a logic high level, i.e., the precharge operation of the pair of local I/O lines LIO<0> and /LIO<0>, the overdriving signal OVDB becomes a logic low level. When the fourth to sixth PMOS transistors PM17 to PM19 of the second upper precharging unit 750 are turned on according to the overdriving signal OVDB, the pair of local I/O lines LIO<0> and /LIO<0> is overdriven to the voltage level of the external voltage VDD for the predetermined time period of the second delay unit 774A.

On the other hand, at the moment of the overdriving signal OVDB being enabled, after the delay time of the first delay unit 772A, the precharging signal PCGB becomes a logic low level. When the first to third PMOS transistors PM14 to PM16 of the first upper precharging unit 730 are turned on according to the precharging signal PCGB, the pair of local I/O lines LIO<0> and /LIO<0> is precharged to the voltage level of the core voltage VCORE.

Consequently, in all of the first to third embodiments, the pair of local I/O lines LIO<0> and /LIO<0> at the overdriving interval is overdriven to the voltage level of the external voltage VDD, and at the disable period, the pair of local I/O lines LIO<0> and /LIO<0> is driven to the voltage level of the core voltage VCORE.

As described above, in the precharging operation, the pair of local I/O lines LIO<0> and /LIO<0> is overdriven to the voltage level of the external voltage VDD in response to the overdriving signal OVDB which is enabled for the predetermined time period at the initial interval of the precharging operation, and the pair of local I/O lines LIO<0> and /LIO<0> may be normal-driven to the voltage level of the core voltage VCORE at the normal driving interval in response to the precharging signal PCGB. Therefore, in the invention, it is possible to get the pair of local I/O lines LIO<0> and /LIO<0> to the precharging voltage level in a faster way.

Further, since in the precharge operation, the power is consumed at the external voltage VDD, the problem caused only by using the core voltage VCORE in the conventional precharge operation may be solved and the consumption power of the core voltage VCORE in the precharge operation may be reduced.

Accordingly, the whole operation speed of the circuit can be increased by rapidly making the voltage level of the data line to the precharging voltage level. Moreover, the circuit operation is more stable and more reliable by reducing the consumption power of the core voltage in the precharging operation to guarantee the stable voltage level.

As described above, in accordance with the invention, a precharging interval of a pair of local I/O lines is divided to an overdriving period and a normal period, wherein at the overdriving period, the pair of local I/O lines is overdriven to a voltage level of an external voltage VDD, and at the normal period, the pair of local I/O lines is normal-driven to the voltage level of the core voltage VCORE. As a result, a rapid precharging operation of the pair of local I/O lines can be guaranteed and a problem of suddenly consuming current in the core voltage VCORE can be solved.

While the invention has been particularly shown and described with reference to the exemplary embodiments described above, it will be understood by those skilled in the art that these exemplary embodiments do not limit the scope of the invention. Rather, various changes in form and details may be made without departing from the spirit and scope of the invention as defined by the appended claims.

What is claimed is:

1. A semiconductor memory device, comprising:
    a write driver configured to load data applied to a first data line onto a second data line;
    a first precharging unit configured to precharge the second data line to a precharging voltage during a precharning operation in response to a precharging signal; and
    a second precharging unit configured to overdrive the second data line to a voltage higher than the precharging voltage for a predetermined time period at an initial interval of the precharging operation in response to an overdriving signal, wherein the predetermined time period partially overlaps a time period that the first precharging unit is turned on during the precharging operation.

2. The semiconductor memory device as claimed in claim 1, wherein the second data line includes a second main data line and a second sub data line, and the first precharging unit precharges the second main and sub data lines using a first source voltage.

3. The semiconductor memory device as claimed in claim 2, wherein the first precharging unit comprises:
    a first MOS transistor, including a source-drain path connected between the first source voltage and the second main data line, and a gate receiving the precharging signal;
    a second MOS transistor, including a source-drain path connected between the first source voltage and the second sub data line, and a gate receiving the precharging signal; and
    a third MOS transistor, including a source-drain path connected between the second main data line and the second sub data line, and a gate receiving the precharging signal.

4. The semiconductor memory device as claimed in claim 2, wherein the second precharging unit drives the second main and sub data lines using a second source voltage.

5. The semiconductor memory device as claimed in claim 4, wherein the second precharging unit comprises:
    a first MOS transistor, including a source-drain path connected between the second source voltage and the second main data line, and a gate receiving the overdriving signal;
    a second MOS transistor, including a source-drain path connected between the second source voltage and the second sub data line, and a gate receiving the overdriving signal; and
    a third MOS transistor, including a source-drain path connected between the second main data line and the second sub data line, and a gate receiving the overdriving signal.

6. The semiconductor memory device as claimed in claim 4, wherein the second precharging unit includes a MOS transistor having a source-drain path connected between the second source voltage and the first source voltage, and a gate receiving the overdriving signal.

7. The semiconductor memory device as claimed in claim 4, wherein the second source voltage is an external source voltage.

8. The semiconductor memory device as claimed in claim 1, further comprising a signal-generating unit configured to generate the precharging signal and the overdriving signal in response to a reset signal.

9. The semiconductor memory device as claimed in claim 8, wherein the overdriving signal is enabled in response to the reset signal and has pulse width corresponding to the predetermined time period.

10. The semiconductor memory device as claimed in claim 8, wherein the signal-generating unit includes: a precharge signal generating unit configured to generate the precharge signal in response to the reset signal; and an overdriving signal generating unit configured to generate the overdriving signal in response to the reset signal.

11. The semiconductor memory device as claimed in claim 10, wherein the precharge signal-generating unit includes: a delay unit configured to receive and delay the reset signal; and an output unit configured to receive the reset signal and an output signal of the delay unit, to output the precharging signal.

12. The semiconductor memory device as claimed in claim 11, wherein the delay unit includes a plurality of inverters connected in series.

13. The semiconductor memory device as claimed in claim 10, wherein the overdriving signal generating unit includes: a delay unit configured to receive the reset signal and then delay the reset signal for the predetermined time period; and an output unit configured to receive the reset signal and an output signal of the delay unit, to output the overdriving signal.

14. The semiconductor memory device as claimed in claim 13, wherein the delay unit includes a plurality of inverters connected in series.

15. A semiconductor memory device, comprising:
a unit memory cell region sharing a first and a second data line;
a write driver for loading data applied to the first data line on the second data line;
a first precharging unit for precharging the second data line to a precharging voltage in response to a reset signal;
a second precharging unit, configured to precharge the second data line to the precharging voltage in response to a precharging signal, the first precharging unit and the second precharging unit respectively being located on opposite first and second sides of the unit memory cell region; and
a third precharging unit, configured to overdrive the second data line to a voltage higher than the precharging voltage in response to an overdriving signal enabled only for a predetermined time period at an initial precharging interval of the second data line, the third precharging unit being located on the second side of the unit memory cell region.

16. The semiconductor memory device as claimed in claim 15, wherein the second data line includes a second main data line and a second sub data line, the second precharging unit precharges the second main and sub data lines by using a first source voltage, and the third precharging unit drives the second main and sub data lines by using a second source voltage.

17. The semiconductor memory device as claimed in claim 16, wherein the second precharging unit comprises:
a first MOS transistor including a source-drain path connected between the first source voltage and the second main data line, and a gate receiving the precharging signal;
a second MOS transistor including a source-drain path connected between the first source voltage and the second sub data line, and a gate receiving the precharging signal; and
a third MOS transistor including a source-drain path connected between the second main data line and the second sub data line, and a gate receiving the precharging signal.

18. The semiconductor memory device as claimed in claim 16, wherein the third precharging unit comprises:
a first MOS transistor including a source-drain path connected between the second source voltage and the second main data line, and a gate receiving the overdriving signal;
a second MOS transistor including a source-drain path connected between the second source voltage and the second sub data line, and a gate receiving the overdriving signal; and
a third MOS transistor including a source-drain path connected between the second main data line and the second sub data line, and a gate receiving the overdriving signal.

19. The semiconductor memory device as claimed in claim 16, wherein the third precharging unit includes a MOS transistor having a source-drain path connected between the second source voltage and the first source voltage, and a gate receiving the overdriving signal.

20. The semiconductor memory device as claimed in claim 16, wherein the second source voltage is an external source voltage.

21. The semiconductor memory device as claimed in claim 15, further comprising a signal generating unit confignred to generate the precharging signal and the overdriving signal in response to the reset signal, the overdriving signal being enabled in response to the reset signal and having a pulse width corresponding to the predetermined time period.

22. The semiconductor memory device as claimed in claim 21, wherein the signal generating unit includes: a precharge signal generating unit confignred to generate the precharge signal in response to the reset signal; and
an overdriving signal generating unit confignred to generate the overdriving signal in response to the reset signal.

23. A method for driving a semiconductor memory device, comprising:
precharging a data line to a precharging voltage during a precharging operation in response to a precharging signal; and
overdriving the data line to a voltage higher than the precharging voltage for a predetermined time period at an initial interval of the precharging operation in response to an overdriving signal, wherein the predetermined time period partially overlaps a time period that the data line is precharged to the precharging voltage during the precharging operation.

24. The method as claimed in claim 23, further comprising generating the precharging signal and the overdriving signal in response to a reset signal to precharge the data line.

25. The method as claimed in claim 23, wherein the voltage higher than the precharging voltage is an external source voltage.

* * * * *